United States Patent [19]

Paulsen

[11] 4,089,040

[45] May 9, 1978

[54] ELECTRICAL/ELECTRONIC RACK AND PLUG-IN MODULES THEREFOR

[75] Inventor: Donald E. Paulsen, Redmond, Wash.

[73] Assignees: The Boeing Company, Seattle, Wash.; Aeritalia S.p.A., Naples, Italy

[21] Appl. No.: 653,023

[22] Filed: Jan. 28, 1976

[51] Int. Cl.$^2$ ............................................. H05K 7/20
[52] U.S. Cl. .............................. 361/383; 174/16 R; 361/384
[58] Field of Search ................. 317/99, 100, 101 R, 317/101 CB, 101 DH, 118, 120; 174/15 R, 16 R; 361/383, 384, 380; 165/11, 80

[56] References Cited

U.S. PATENT DOCUMENTS

| | | | |
|---|---|---|---|
| 2,843,806 | 7/1958 | O'Neill | 174/16 R |
| 2,938,686 | 5/1960 | Van Winkle | 244/118 |
| 3,139,559 | 6/1964 | Heidler | 317/100 |
| 3,188,524 | 6/1965 | Williams | 317/101 |
| 3,224,221 | 12/1965 | Raskhodoff | 174/16 R |
| 3,601,661 | 8/1971 | Kleinhauple, Jr. | 317/100 |

*Primary Examiner*—Gerald P. Tolin
*Attorney, Agent, or Firm*—Christensen, O'Connor, Johnson & Kindness

[57] ABSTRACT

A pair of like electrical/electronic equipment racks are uniquely arranged in an avionics bay located in the belly (lower lobe) of a wide-bodied aircraft, with the fronts of the racks facing a central access aisle that extends lengthwise of the fuselage between the racks, and with the rear of each rack facing one of two outboard aisles that extend parallel to the central aisle along the sides of the bay. At the forward end of the bay, a transversely extending passageway interconnects the central aisle with the two outboard aisles and enables the ground crew to access both the front and rear of each rack by entering the bay through a ground access hatch disposed in the lower most central portion of the fuselage and opening into the bay at the central aisle. Emergency in-flight access to the bay from the upper lobe, by in-flight personnel, is also available through a hatch disposed in a deck lying above and slightly aft of the avionics bay. Each rack is constructed of a light-weight, but rugged framework that defines a plurality of elevationally spaced module receiving compartments, each compartment accommodating a plurality of side-by-side plug-in modules. The rack framework together with certain partitions a module receiving guide and support rails, and the modules themselves, are uniquely constructed and arranged to define an air circulating system that receives forced cooled air and circulates it through the modules to carry away heat generated by the electrical and electronic components therewithin. Complemental connector parts are separately affixed to the rear of the module and to the rear of the rack, respectively, such that each module is installed and removed from the front of the rack, while the connector parts are engaged and disengaged, respectively, adjacent the rear of the rack. To assist in overcoming the frictional forces associated with the engagement and disengagement of the connector parts, a jackscrew mechanism is provided including a rod that extends between the front and rear panels of the module, and a nut secured to the rack at the rear thereof and coacting with a threaded, rearwardly protruding end of the rod. During module insertion, manual rotation of the rod at the front of the rack causes a cinching force to be exerted at the rear of the module and rack immediately adjacent the connector parts to effect engagement thereof. Counter-rotation of the rod exerts a reverse, separating force between the connector parts to initiate removal of the module.

3 Claims, 10 Drawing Figures

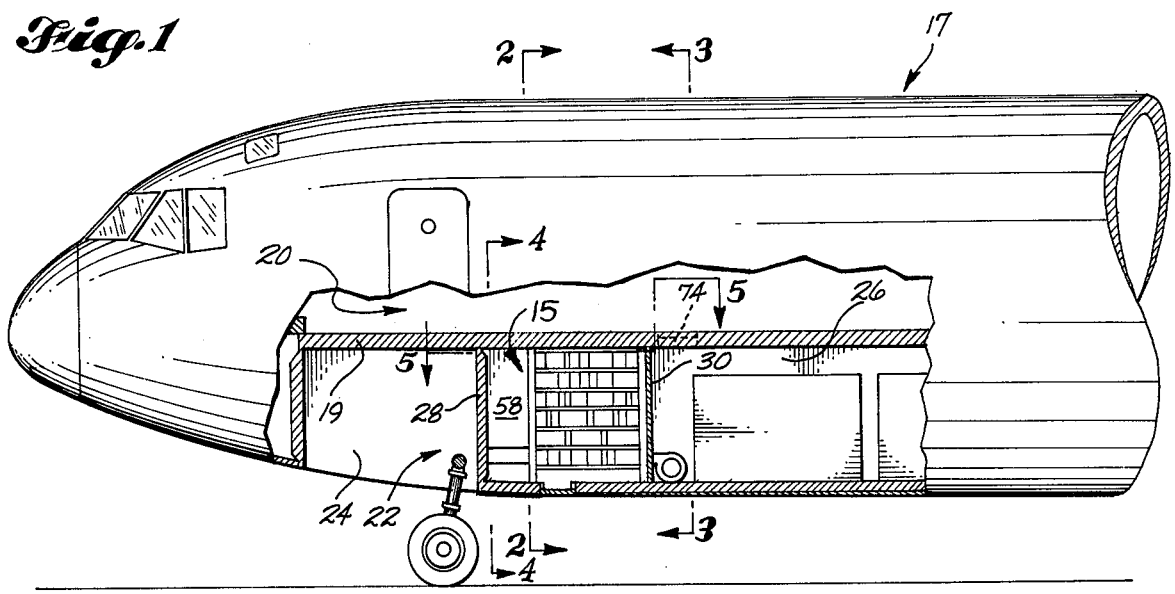
Fig. 1
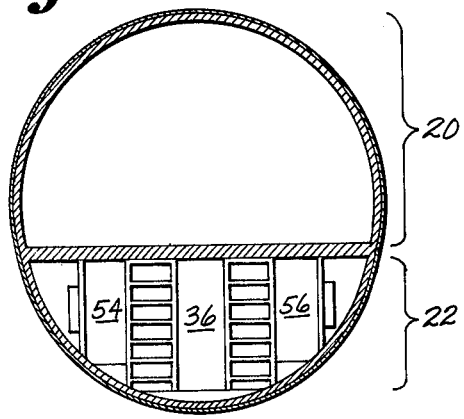
Fig. 2
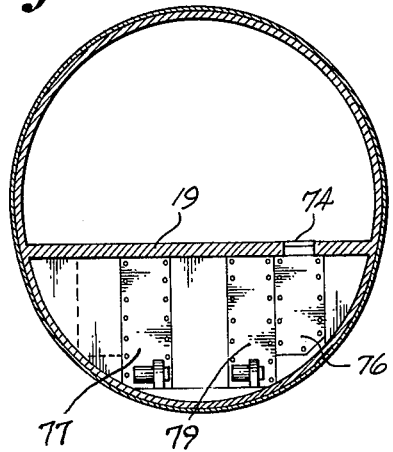
Fig. 3
Fig. 4

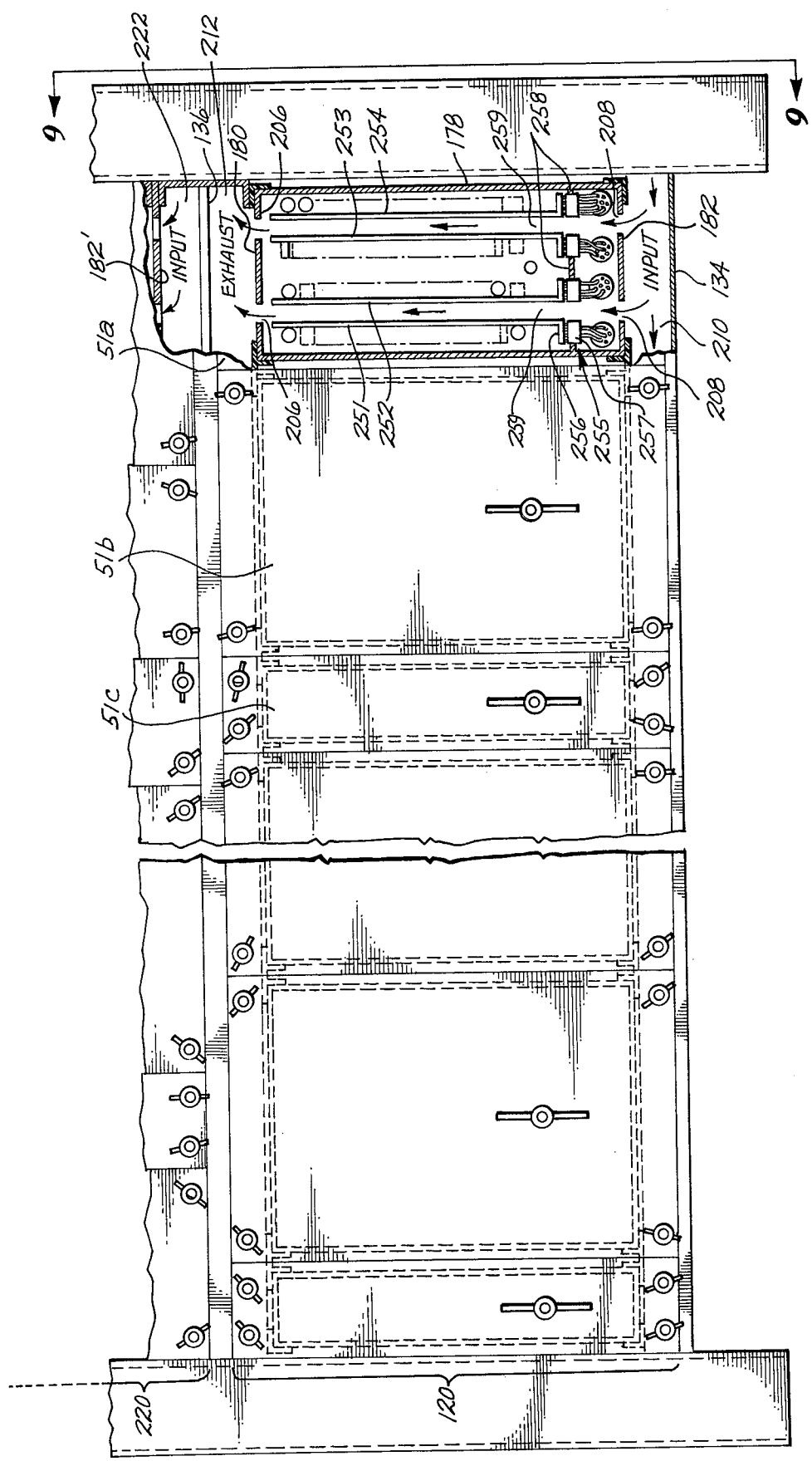

ELECTRICAL/ELECTRONIC RACK AND PLUG-IN MODULES THEREFOR

BACKGROUND

In general the present invention relates to the mounting of electrical and electronic equipment, and more particularly to a rack assembly for receiving plug-in modules, each module housing a portion of the electrical/electronic circuitry. Although the invention has utility in a wide variety of installations, in its preferred form it is particularly suited for mounting electrical and electronic circuits and components carried in an aircraft (such circuits and components being referred to herein as avionics equipment).

The mounting of electrical and electronic equipment many times requires ready accessibility of the circuit components and wiring, for testing and servicing. This is especially true for avionics equipment, where the proper operation of the equipment may be crucial to safe flight of the aircraft. It is therefore desirable to mount such equipment on supporting racks that are readily accessible to ground crews from the exterior of the aircraft when it is grounded and to the crew from the interior of the aircraft when in flight. Heretofore, the avionics equipment has not been easily accessible when airborne. And accessibility that has been provided, while airborne or grounded, has been restricted to the front of the equipment racks. In such installations, plug-in avionic units can be removed and reinserted from the fronts of the racks, but wiring at the rear of the racks is reachable only with difficulty by stretching an arm through from the front rack openings, thereby rendering certain repairs difficult, and others possible only after dismantling portions of the rack.

The construction of the racks and plug-in units is further complicated by the requirement that the electronic components in the units be cooled by circulating air through the units. Heretofore, the manner in which cooling air has been circulated, has not resulted in an efficient use of the available coolant. For example, there are: prior designs that force the air downwardly through the units against the natural convective flow of warm air; designs that circulate air past the components themselves thereby depositing particulate contaminants carried by the air onto the electrical components, the build-up of contaminants impairing transfer of heat from the components to the coolant; and designs that unintentionally but inherently circulate the coolant proximate some components while by-passing others.

The avionics equipment is usually mounted in plug-in units, each removable for service, repair or replacement. In most prior art designs, considerable insertion and withdrawal forces have been required to overcome the friction forces that oppose the engagement and disengagement of the unit-mounted connector parts with the complemental rack-mounted connector parts. Mechanical lever devices carried on the front panel of the plug-in units and connectable to the fronts of racks have been provided to assist in achieving engagement and disengagement. However such mechanical assists have merely created new problems. For one, deformation of the housing of the plug-in unit (usually constructed of light-weight sheet metal) frequently results from loads placed thereon during operation of the mentioned levers. Such deformation can cause misalignment of pins on the connectors on the unit and the racks which in turn can cause damage to the pins and also increase the friction that must be overcome during insertion or withdrawal. To side-step this problem, the number of connector pins on each plug-in unit (and thus the number of electrical connections to and from the unit) has been limited.

Accordingly it is an object of the present invention to provide an assembly including a rack and a plurality of plug-in modules, each containing electrical and/or electronic circuits and components, in which the rack and plug-in modules are constructed and arranged to provide ready accessibility to the modules, efficient circulation of coolant air in proximity to the circuits and components within each module, and efficient utilization of the available space within the rack.

Another object of the present invention is to provide an assembly of a rack and a plurality of plug-in modules, wherein each plug-in module houses electrical and/or electronic circuits and components and has affixed thereto a connector part that is engagable with a complemental connector part affixed to the rack, and wherein such modules are easily insertable into and withdrawable from the rack, and wherein the number of contacts permitted in each connector is not unduly limited by the friction forces that occur during insertion and withdrawal of the modules.

SUMMARY OF THE INVENTION

In accordance with the principles of the invention, there is provided an assembly for mounting electrical/electronic equipment including a rack and one or more equipment containing modules, of the plug-in type, removably supported by the rack. The rack and modules are constructed and arranged to form a unique and exceedingly efficient cooling system for circulating cool air past the circuits and components within each module, and in particular the rack has a framework that defines one or more module receiving compartments, each compartment being bounded by mutually opposed surfaces of spaced-apart solid wall panels. Each module includes a housing having spaced apart apertured panels, through which cool air can be circulated, and when mounted in the racks compartment, one of these apertured panels is opposed and slightly spaced-apart from one of the rack panels to define with the rack framework a first air circulating plenum chamber, while the remaining apertured panel of the module and the remaining panel of the rack similarly define together with the rack framework a second plenum chamber. The first chamber is adapted to receive forced cool air and to direct it into the module housing through the openings of the apertured panel that in part defines such first chamber. The second chamber is adapted to exhaust the spent air flowing out of the module housing from openings in the apertured panel that in part defines such second chamber.

In the preferred form of the assembly, as more fully disclosed herein, the rack is provided by an upstanding framework that defines a plurality of elevationally spaced compartments, each compartment in turn being bounded by elevationally spaced-apart horizontal solid wall panels defining the top and bottom of such compartment. Within each compartment, a plurality of elongate, spaced-parallel rails are mounted for supporting a row of side-by-side modules. The rails also guide the insertion and removal of the modules and form partial air seals between the rack framework and the modules and in some cases between the modules themselves to confine the circulating air to the plenum chambers and to the module housings. The apertured panels of each module housing are disposed at the top and bottom, respectively, of the housing so that the bottom apertured panels of a given row of modules define with framework and with the solid wall panel at the bottom of the compartment a first plenum chamber for such row, while the top apertured panels of the same row of modules defines with the framework and with the solid wall panel at the top of the compartment a second plenum for such row. In this manner, the lowest compartment has adjacent its bottom the first plenum chamber which is used as an input for receiving cool air and for directing such air upwardly through the module housings of the lowest row. The second plenum chamber (adjacent the top of the row) provides an exhaust for carrying away spent coolant air that has been discharged through the top apertured panels of such row of modules. Similar input and exhaust plenum chambers are defined adjacent the bottom and top, respectively, of the upper compartment of serving the row of modules therein. In the preferred construction of the multiple compartment rack, only one of the horizontal, solid wall panels is used between adjacent rows of modules so that the lower and upper surfaces of such panel define the top of the underlying compartment and the bottom of the overlying compartment, respectively. In this way, the last mentioned panel serves as a partition that divides the space between such adjacent rows of modules into a pair of chambers, including a first plenum chamber above the panel which serves as the input plenum for the row of modules thereabove and a second plenum chamber below the panel that serves as the exhaust plenum for the row of modules therebelow.

In this manner, a lightweight rack and module assembly is provided, in which the rack is formed by a framework that is substantially open to the front, rear and sides, with the only solid boundaries being the framework itself, the guide and support rails and the horizontal panels defining each rack compartment. Each of the panels disposed between adjacent rows of modules may be of a lightweight material, inasmuch as they do not bear any physical loads, other than slight differential air pressure. Preferably such panels have thermal insulative characteristics to thermally insulate the temperature difference between the air in the input plenum and the warmer air in the adjacent exhaust plenum. Each row of modules is thus provided with fresh coolant, undiminished by the proximity to the warmer exhaust air. Additionally, by a particular arrangement of the electrical and/or electronic components on printed circuit boards or cards, the cool within the module housings, air is circulated through each module in a manner that effectively carries away excess heat without causing a build-up (by particulate deposition) of contaminants (carried by the coolant) on the sensitive electronic components.

To assist in the insertion and withdrawal of each of the plug-in modules, a jack screw mechanism is provided including a rod extending between front and rear panels of the module and journaled for rotation therein. The end of the rod at the front panel is equipped with a adapted for being manually rotated. Means affixed at the rear of the rack compartment, is threadably engagable with a second end of the rod adjacent a rear panel of the module and proximate a module mounted connector part carried by such rear panel. During insertion of the module, its connector part is brought into proximity with a complemental connector part affixed to the rack at the rear of the compartment. Rotation of the rod at the front panel causes the mentioned means to exert a highly, leveraged cinching force on the rear panel of the module drawing it and the connector part mounted thereon toward and into engagement with the complemental connector part affixed to the rack. A similar mechanical assist is provided for disengagement of the connector parts during removal of the module. During both insertion and removal, the highly leveraged force is applied at the rear of the module, in close proximity to the connector parts, thereby avoiding deformation of the module housing and consequent misalignment of the connector pins that would occur if the equivalent force was applied to the front panel of the module and transmitted to the connector parts through the housing.

These and further features, objects and advantages of the invention will become apparent to those skilled in the art from the following detailed description and appended drawings.

BRIEF DESCRIPTION OF THE DRAWINGS

FIG. 2 is a cross-sectional view taken along line 2—2 of FIG. 1, and thus showing a view of the avionics bay that would be seen from a forward part of the bay looking aft.

FIG. 3 is a cross-sectional view taken along line 3—3 of FIG. 1, showing a view of an aft wall of the avionics bay when looking forward from a lower lobe cargo bay.

FIG. 4 is an enlarged, cross-sectional view similar to FIG. 2, but taken from a position slightly forward thereof along line 4—4 of FIG. 1.

FIG. 7 is an exploded, fragmentary view of a portion of one of the rack and module assemblies shown in FIGS. 1-6 for mounting the avionics equipment of the aircraft in the avionics bay.

FIG. 8 is a front elevational view of a portion of one of the rack and module assemblies shown in FIGS. 1-6 in which the front panel of one of the modules is cut away to expose the interior structure and components of the rack and module.

DESCRIPTION OF THE PREFERRED EMBODIMENTS

Figure 1:
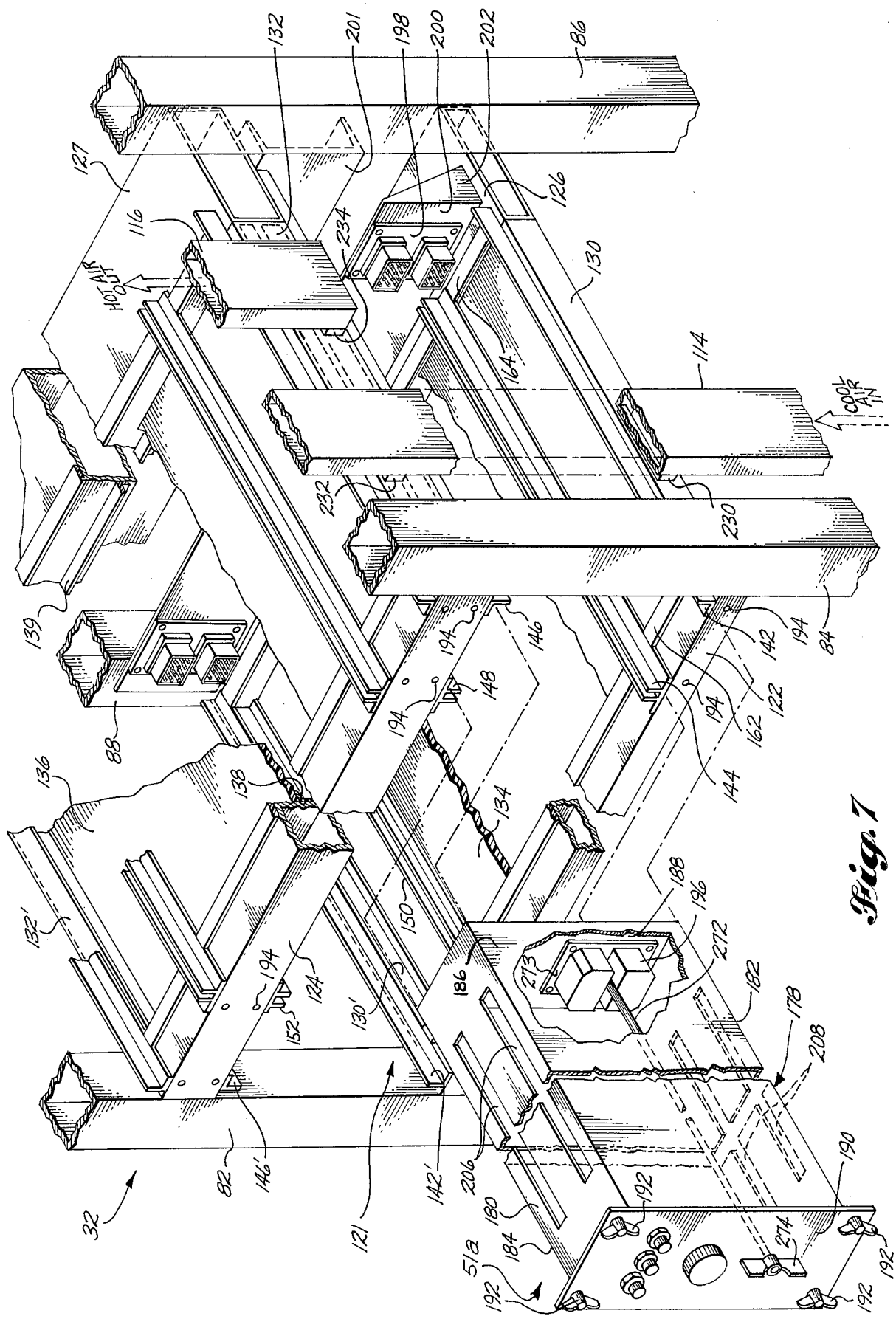
FIG. 1 is an elevational view of the forward portion of an aircraft fuselage in which a lower portion of the fuselage is shown in a sectional view taken on a vertical plane along the longitudinal axis of the fuselage to show the interior arrangement of the avionics bay located in a lower lobe.

With reference to FIG. 1, a rack and module assembly constructed in accordance with the principles of the present invention is shown in the environment of an avionics bay 15 within an aircraft fuselage 17. More particularly the fuselage 17 is of a wide-bodied type commercial transport aircraft (such as the Model 747 aircraft manufactured by The Boeing Company of Seattle, Washington) and includes a horizontal deck 19 that extends substantially the entire length of fuselage 17 and divides the fuselage into an upper, passenger carrying lobe 20 and a lower, equipment and cargo lobe 22. The avionics bay 15 is positioned within lower lobe 22 between the nose wheel well 24 and the forward cargo bay 26, and is bounded by the underside of deck 19, the interior wall of the lower lobe 22 of fuselage 17, a transversely extending forward wall 28 and a transversely extending aft wall 30.

Figure 5:
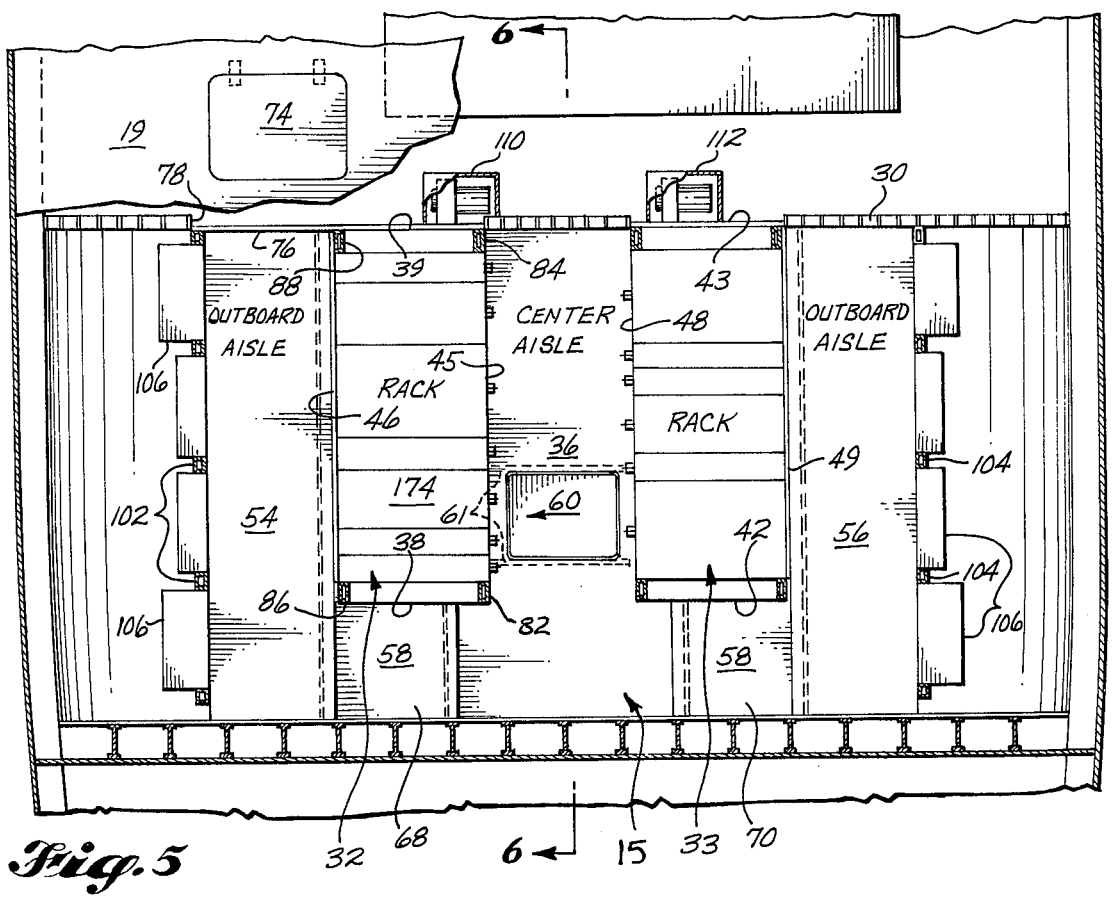
FIG. 5 is a cross-sectional view taken from a position overlying the avionics bay, and generally following line 5—5 of FIG. 1.
Figure 6:
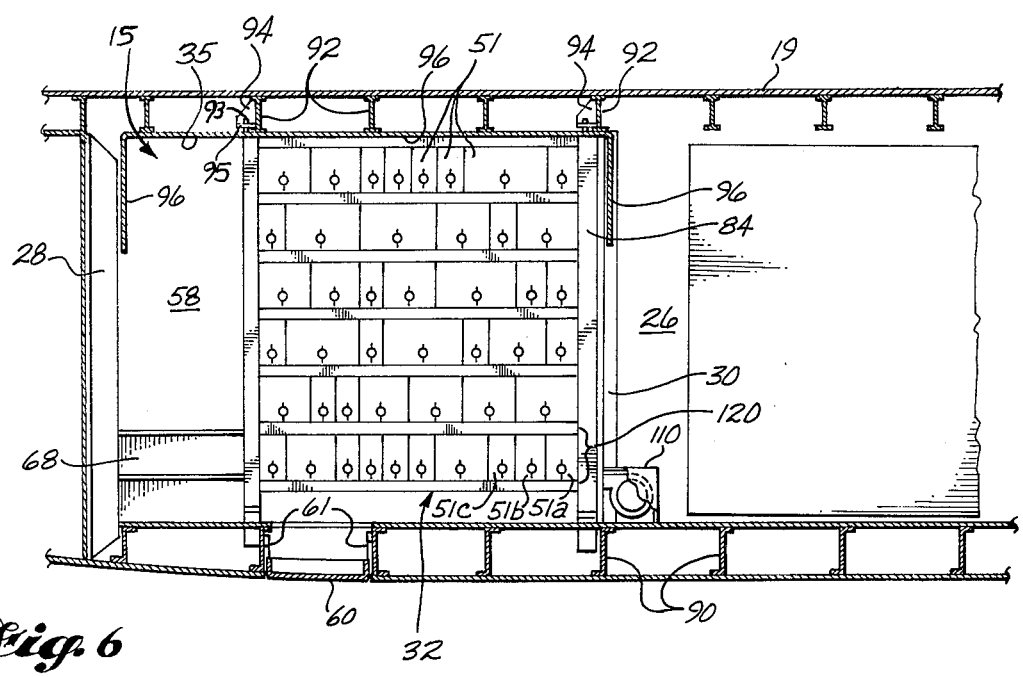
FIG. 6 is a cross-sectional view taken along line 6—6 of FIG. 5.

As also disclosed, and separately claimed in U.S. application Ser. No. 857,432, divided from the present application, bay 15 (FIGS. 2–6) has installed therewithin, two avionics equipment racks 32 and 33 (FIGS. 2, 4 and 6), each having an outer profile generally in the shape of a right parallelpiped, mounted upright between the contoured interior wall portion 34 of lower lobe 22 and a ceiling 35 defined by the underside of deck 19. Racks 32 and 33 are disposed on opposite sides of a central access aisle 36 that extends longitudinally of the fuselage between forward and aft walls 28 and 30 of bay 15 (FIGS. 4 and 6). Each rack has a height dimension between wall portion 34 and ceiling 35, a width dimension extending longitudinally of fuselage 17 between the sides of each rack, namely sides 38 and 39 of rack 32 and sides 42 and 43 of rack 33 (FIG. 6), and a depth dimension between the front and rear of each rack, namely the front 45 and rear 46 of rack 32, and the front 48 and rear 49 of rack 33 (FIG. 4). The fronts 45 and 48 of both racks face the center aisle 36, and from aisle 36, access is had to the plurality of plug-in, avionic modules 51 (FIG. 6) that are inserted into the racks from the fronts thereof.

Each of these modules 51 extends to the rear of the respective racks, whereat a module-mounted connector part plugs into a rack-mounted complemental connector part. From the rack-mounted connector part, permanently installed rack wiring extends both to other rack-mounted connectors and to the various electrical systems located throughout the aircraft. Acccess to this rack wiring is available via two outboard access aisles 54 and 56 extending longitudinally of the fuselage along the rear of racks 32 and 33, respectively, between forward and aft walls 28 and 30 of bay 15, and thus parallel to center aisle 36. A transverse passageway 58, at the forward end of bay 15, interconnects center aisle 36 with both outboard aisles 54 and 56, so that the outboard aisles can be reached upon entering center aisle 36 via a ground access hatch 60 in the bottom center of lobe 22 and opening into center aisle 36, somewhat aft of passageway 58. A cover for hatch 60 is mounted between a pair of adjacent ribs 90 and is movable on tracks 61 (FIGS. 5–6) that extend from the hatch opening, first upwardly and then transversely under rack 32, so as to be operable by an initial upward motion followed by a transverse sliding motion that tucks it out-of-the-way within the flooring underlying rack 32, in a manner similar to the construction and operation of the avionics bay ground access hatch used on aircraft Model 727 manufactured by The Boeing Company of Seattle, Washington. The floors 62 and 64 of outboard aisles 54 and 56 are elevated with respect to the floor 66 of center aisle 36 because of the semicircular contour of the interior wall 34 of the lower lobe 22, and thus two sets of stairs 68 and 70 are provided in passageway 58 to facilitate passage to and from the outboard aisles. Floors 62 and 64 of the outboard aisles, being above the lowermost portions of racks 32 and 33 are removable to afford access to rack wiring situated therebelow.

An inflight access hatch 74 (FIGS. 3 and 5) is located in deck 19 somewhat aft of bay 15, in line with outboard aisle 54 for personnel passage between the upper and lower lobes 20 and 22. The cover for hatch 74 is openable by flight personnel from the upper lobe 20, allowing them to drop down into the cargo bay 26 in lower lobe 22, and from there enter bay 15 via outboard aisle 54 by removing a detachable panel 76 (FIG. 3) that closes an opening 78 in aft wall 30 of the avionics bay 15. The location of hatch 74 has been positioned in an accessible, open floor area in the upper lobe 20, such as in an aisle between passenger seats, and aft of the avionics bay 15, where the latter placement circumvents a liquid impervious liner 96 (shown in FIG. 6 and discussed more fully herein) that lines the ceiling of bay 15.

Access to wiring routed vertically on the sides 39 and 43 of racks 32 and 33 at the aft end of bay 15 may be had, from cargo bay 26, by removing detachable panels 77 and 79 in aft wall 30 as best shown in FIG. 3.

Each of racks 32 and 33 has a framework of rigid, structural members. These include four stanchions, such as shown in FIG. 5 for rack 32 as: a pair of front stanchions 82 and 84 located at the intersections of the front 45 and sides 38 and 39, respectively, and a pair of rear stanchions 86 and 88 located at the intersections of the rear 46 and sides 38 and 39, respectively. The lower ends of these stanchions are affixed to the ribs 90 (FIG. 6), while the upper ends of the stanchions are connected to the joists 92 of deck 19 by pin and bracket assemblies 94 which secure the top of the rack against horizontal movement but at the same time allow vertical flexure of deck 19 relative to the top of the rack. Assemblies 94 each include an upstanding pin 93 affixed to the associated rack stanchion and a horizontally disposed, apertured plate 95 mounted to joists 92 in which the pin 93 slidingly resides.

To protect the sensitive avionics equipment from moisture, such as caused by liquid spillage on deck 19 by passengers or crew personnel, a liquid impervious liner 96 (FIGS. 4 and 6) lines the upper portions of bay 15, at ceiling 35, upper interior wall portions 98 and 100 of lobe 22, the upper portion of forward and aft wall 28 and 30. Liner 96 may be a flexible, relatively tough synthetic sheet material, secured by adhesive to flexible furrings (not shown) that are in turn affixed to the ceiling and walls in order to permit joists 92 and the adjacent walls to flex without rupturing the liner. Pins 93 of bracket assemblies 94 (FIG. 6) pass through liner 96, and to avoid any seepage thereat, a suitable seal may be provided between the pin openings in the liner and the associated pins.

Between walls 98 and 100 and outboard aisles 54 and 56 of bay 15, a series of auxiliary power equipment racks 102 and 104 (FIGS. 4 and 5), of conventional framing, may be mounted for supporting a plurality of electrical units 106, such as power distribution units, switching relays etc. Units 106 are accessible via outboard aisles 54 and 56.

For the most part, racks 32 and 33 carry the electronic control circuitry of the aircraft avionics, whereas the electrical power distribution equipment is supported on racks 102 and 104. As described herein, a cooling system is provided for the temperature-sensitive electronics in racks 32 and 33 whereas the electrical power equipment, being less sensitive to temperature variations, is carried by the non-airconditioned racks 102 and 104.

Cool air for circulation through racks 32 and 33 may be ambient air drawn from upper lobe 20 (FIG. 6) and ducted (by ducts not shown) to air blowers 110 and 112 which force cool input air into rack mounted ducts (one of which is shown as air duct 114 in FIG. 7). Cool air is thusly injected into an air circulating system built into racks 32 and 33. Spent coolant, at a warmer temperature, is exhausted from racks 32 and 33 by means of exhaust ducts (one of which is shown as exhaust duct 116 in FIG. 7), that carry away the relatively warm air to a discharge point (not shown) in the forward cargo bay 26 providing a desirable increase in temperature therewithin. Blowers 110 and 112 are located in the cargo bay 26 and are thus separated from the avionics bay 15 by wall 30 to reduce objectionable fan noise within the bay.

With reference to FIGS. 7–10, the construction of the rack and module assembly is illustrated with reference to a section of rack 32, and in particular a portion thereof supporting a lowermost row 120 of avionic modules 51a, 51b, 51c etc. as shown in FIGS. 6 and 8. The exploded view of FIG. 7 illustrates the rack structure making up the lowermost rack compartment 121 for row 120 and shows one of the modules, namely module 51a, in a position removed from the rack. The rack framework, in addition to stanchions 82, 84, 86 and 88, includes a plurality of horizontally extending, elongate front rail support members, such as members 122 and 124 (FIG. 7), a plurality of elongate, horizontally extending rear rail support members, such as members 126 and 127 and a plurality of pairs of elongate, side rail support members, such as pairs of members 130, 130' and 132, 132', respectively. Stanchions 82, 84, 86 and 88 are of tubular construction, having a square cross section, and may be formed of a lightweight metal such as aluminum.

The front, rear and side rail support members are of various shapes (as described more fully herein), are fastened to stanchions 82, 84, 86 and 88 such as by welding, and are arranged at incrementally spaced elevations to define in general a plurality of elevationally spaced module-receiving compartments. One such compartment 121 is shown in FIG. 7. Each compartment is substantially open at the front, rear and sides of rack 32. More specifically as shown in FIG. 7, compartment 121 is defined at the front, sides and rear by stanchions 82, 84, 86 and 88, by front and rear rail support members 122, 124 and 126, 127 and by side rail support members 130, 132 and 130', 132'. The bottom of compartment 121 is defined by a horizontal, solid wall panel 134 (which also can be seen in FIG. 9), that has its perimeter secured to the underside of the set of rail support members 122, 126, 130 and 130'. The top of compartment 121 is bounded by a horizontally disposed, solid wall panel 136 having its front and rear edges resting on front and rear elongated, L-shaped brackets 138 and 139 secured to the inwardly disposed surfaces of the front and rear rail support members 124 and 127. Partition 136 thus resides in elevation, halfway between the upper and lower surfaces of the set of rail support members 124, 127, 132 and 132'.

Within compartment 121, a plurality of elongated, guide and support rails are affixed to the rail support members, as illustrated by a lower set of rails 142 and 144 and an upper set of rails 146 and 148. The rails are mounted in spaced-apart parallelism and extend from the front to the rear of the compartments. The rails serve to guide the insertion and withdrawal of module 51a and to support the module 51a (vertically and horizontally) once it is fully inserted into the rack compartment. The upper and lower outboard rails 142 and 146, respectively, located at the right side of the compartment adjacent stanchions 84 and 86 are of L-shaped cross section. The inboard rails, such as rails 144 and 148, each have a cross section resembling a double-legged "T". The cross member of the T of rails 144 extends between, and is secured to, the upper surfaces of rail support member 122 and 126 and legs of rail 144 extend upwardly into compartment 121. Similarly, the cross member of the T of rail 148 extends between and is secured to the underside of rail support members 124 and 127 and the legs of rail 148 extend downwardly into compartment 121. It will be noted that the legs of rails 144 and 148 form with the cross member two L-shaped portions which face in opposite directions and are joined together by the cross member. The L-shaped portions of rails 144 and 148 that face the accommodating module 51a area of compartment 121 thus form with outboard rails 142 and 146 a set of four guides and supports for the corners of module 51a. The horizontal and vertical spacing between the rails closely match the width and height of the body of module 51a so that module fits snugly therebetween during and after insertion.

The left side of compartment 121 (FIG. 7) carries another set of upper and lower outboard guide and support rails 142' and 146', which are shaped and mounted in generally the same manner as rails 142 and 146 but face in their opposite direction. The former cooperate with an additional set of inboard rails 150 and 152, identical to inboard rails 144 and 148, for defining another set of four guides and supports for the corners for another module.

The L-shaped portions of inboard rails 144, 148, 150 and 152 facing inwardly (away from the sides of compartment 121) are disposed to cooperate with opposed L-shaped portions of additional sets of inboard rails, where the number and spacing of such inboard rails is selected to accommodate a number of side-by-side modules 51 having predetermined widths. By way of example, references made to the lower row of modules 120 in FIG. 6, in which a group of ten such modules, including module 51a (also shown in FIG. 7), having various widths, are arranged in side-by-side. Preferably, the widths of the modules vary only according to multiples of a predetermined smallest unit width, to afford greater standardization of rack and module dimensions.

As more fully described herein, the various guide and support rails 142, 146, 144, 148 etc. (FIG. 7) described above serve the additional purpose of forming an air seal with certain exterior surface portions of the mounted modules. These air seals are extended laterally between the guide rails by a plurality of sealing strips, such as the lower, front and rear sealing strips 162 and 164 disposed on rail support members 122 and 126 and extending laterally between rails 142 and 144. A closed loop sealing ring is thus formed, having an elongate rectangular configuration, open in the interior for sealingly contacting the perimeter of the bottom apertured panel of module 51a. Similar front and rear sealing strips (not visible in the drawings) are affixed laterally between the the upper guide rails 146 and 148 for forming an upper sealing ring that coacts with the top apertured panel of module 51a. Likewise, upper and lower, front and rear sealing strips extend laterally between each pair of horizontally opposed guide and support rails to form closed loop sealing rings for sealing contact with the top and bottom apertured panels of the module supported thereby.

The inboard rails, such as rails 144 and 148, serve the further purpose of closing gaps that are formed near the tops and bottoms of the modules between mutually opposed side walls of adjacent module housings. In doing so, the upper inboard rails in the compartment interconnect all the top apertured panels of the modules and the lower inboard rails interconnect all of the bottom apertured panels of the modules so that the respective top and bottom plenum chambers are fully enclosed.

The guide and support rails and sealing strips may be formed of any suitable lightweight material that is sufficiently strong and tough to withstand the insertion forces and weight loading of modules 51. The rail material may have some resiliency to allow slight deflection of the rails to enable them to conform to the exterior corners of the module and thus maintain the desired, sealing contact therewith. A tough, durable nylon or other similar plastic material has been found suitable. The rails and sealing strips may be secured to the supporting members by means such as rivets, screws, or adhesives.

As previously indicated, the above-described compartment 121 (FIG. 7), serves to accommodate the lowermost row of modules 51, including module 51a, and each of the module compartments residing thereabove, are similarly arranged and dimensioned between elevationally spaced sets of front, rear and side rail support members, such as the set of members 124, 127, 132, 132', each such set having a plurality of front to rear extending guide and support rails and a plurality of laterally disposed sealing strips as described for the lowermost compartment 121. In this respect, it is observed that the lowermost rail support members 122, 126, 130 and 130' have a lesser thickness (vertical dimension) than the intermediate level rail support members 124, 127, 132, 132', so that the latter as described more fully hereinafter can accommodate therebetween a pair of horizontally disposed plenum chambers, divided by horizontal partition 136, while the lowermost set of support members 122, 126, 130 and 130' need only have a thickness that is adequate to accommodate a single plenum chamber. Although not shown, the uppermost set of horizontal support members, like the lowermost set of support members, need only accomodate therebetween a single plenum chamber, lying above the uppermost row of modules, and thus likewise may be of the lesser thickness. Also in association with this upper set of rail support members, a top wall panel 174 is mounted as shown in FIG. 5 having dimensions and mounting similar to bottom panel 134 (FIG. 7). The number of sets of intermediate level rail support members will depend on the number of superimposed rows of modules to be accommodated in each rack. In this embodiment, and as best shown in FIG. 6, a plurality of five intermediate level rail support members are used, each constructed and arranged like the set of members 124, 127, 132 and 132' as shown in FIG. 7, for accommodating six rows of modules.

The front members at the intermediate levels, such as member 124, are tubular and of square cross section matching the shape and size of the front stanchions 82 and 84; the intermediate level rear rail support members, such as member 127, are also of tubular configuration but have a rectangular cross section that is elongate in the depth dimension of the rack, and a vertical dimension or thickness equal to that of member 124; and the side rail support members 132, 132' are channel-shaped and have a vertical dimension equal to that of members 124 and 127. The ends of front support member 124 are suitably secured to the laterally opposed inside faces of front stanchions 82 and 84, such as by welding, with the front and rear faces of the stanchions 82 and 84 being flush with the corresponding faces of member 124. Rear rail support member 127 is similarly secured, such as by welding, between the laterally opposed inside faces of the rear stanchions 86 and 88, with the rear face of member 127 flush with the rear faces of stanchions 86 and 88 and the front face of member 127 spaced forwardly from the forward faces of the rear stanchions 86 and 88. Side rail support members 132, 132' are disposed with their rearward ends secured to the forwardly protruding face of member 127 and their forward ends secured to the rear faces of the front support member 124. The bridging portion of each of channel shaped members 132 and 132' is arranged in a vertical plane substantially flush with the inside faces of the front and rear pairs of stanchions 84, 86 and 82, 88, respectively, and the flange portions of each such member extend horizontally inwardly from the rack sides and have upper and lower surfaces flush with the upper and lower surfaces of the front and rear support members 124 and 127. The rail support members at each intermediate level are similarly constructed.

The lowermost level of rail support members 122, 126, 130, 130' and the uppermost level of such members (not shown) are formed and arranged similarly to the above-described intermediate level members 124, 127, 130 and 132' and differ only in that the former members are approximately one-half the height (vertical dimension) of the latter.

Figure 9:
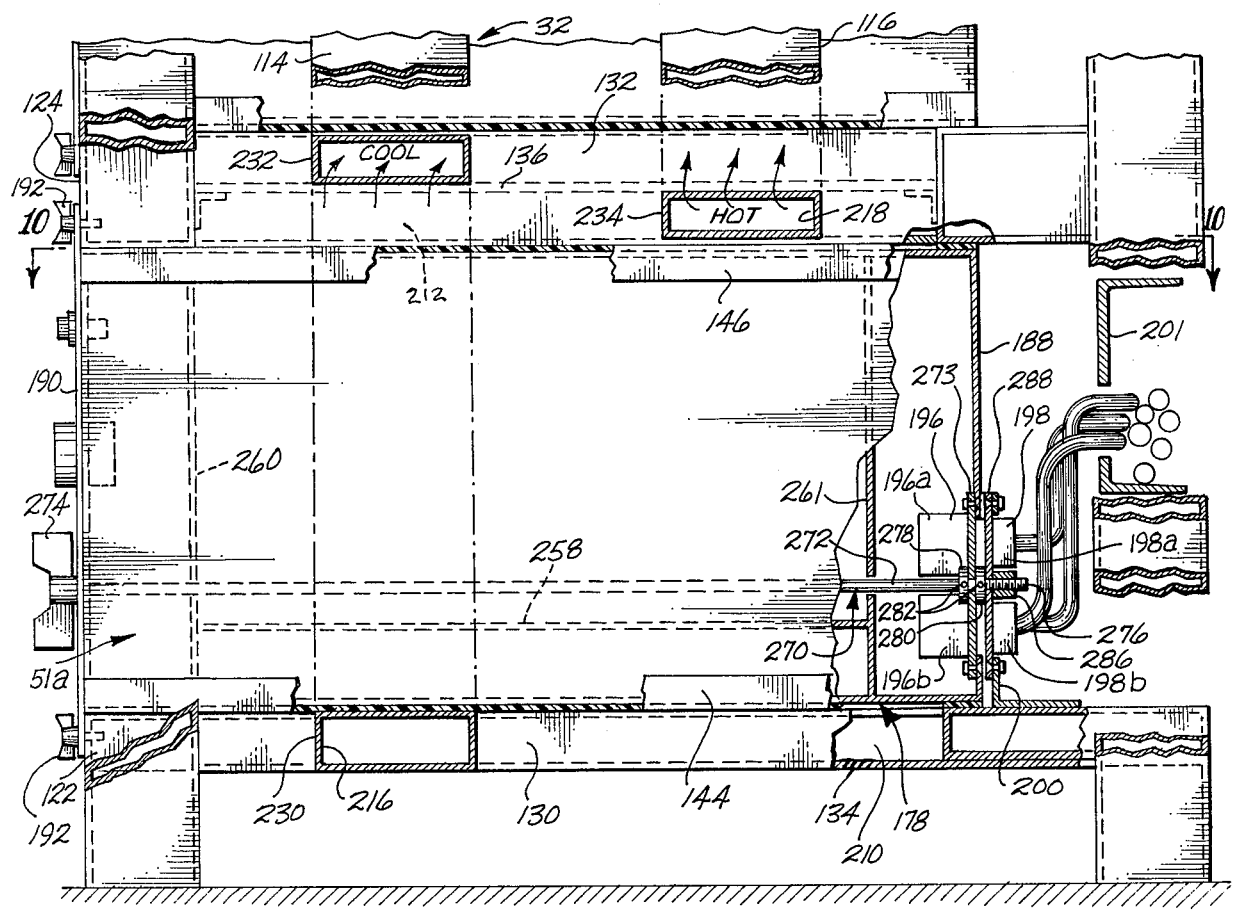
FIG. 9 is a side elevational view of the rack and module assembly shown in FIG. 8, taken along line 9—9 of FIG. 8, with various portions of the assembly being cut away at different depths into the figure to expose the interior structure and components of the assembly.

At the rear of compartment 121 (FIG. 7) a multi-contact connector plug 198 is mounted to a horizontally elongated bracket 200, carried by rear rail support member 126. Bracket 200 has gussetted ends 202 for rigidifying the upright portion of the bracket when loaded by insertion and withdrawal forces exerted on plug 198 by a complemental receptacle carried by module 51a. Similar additional plugs are mounted on bracket 200, in rearward registry with complemental receptacles on each of modules 51. Rack wiring to and from each rack mounted plug 198 may be routed in a horizontally extending, rearwardly facing channel member 201 secured to rear stanchions 86 and 88 (FIGS. 7 and 9).

Each of the avionics modules, such as represented by module 51a (FIG. 7) is constructed of an enclosed sheet metal housing 178 in the shape of a right parallelepiped, formed by top and bottom apertured panels 180 and 182 side panels 184 and 186 a rear panel 188, and a front control/indicator panel 190. Panel 190 is dimensioned such that its outer perimeter protrudes beyond the adjoining forward edges of the top, bottom and side panels 180, 182, 184 and 186 thus defining a front mounting flange. A plurality of wing-headed mounting screws 192 are carried by the flanged portion of panel 190 for engaging threaded mounting holes 194, provided in the front face of the front rail support members 122 and 124. The electrical and electronic avionics circuits and components are mounted inside housing 178 (shown in FIGS. 8 and 10) and are electrically connected to a multi-contact connector receptacle 196 complemental to 198.

The height and width dimensions of housing 178, to the rear of front panel 190, are selected to form a sliding, friction fit with rails 142, 144, 146 and 148, such that the exterior corners of housing 178 defined by the junctures of sidewalls 184 and 186 and top and bottom walls 180 and 178 are snugly slidable into the rearwardly extending interior corners defined by the aforementioned rails. When fully inserted, receptacle 196 is engaged with rack mounted plug 198 and the mounting flange of front panel 190 lies flush against the front rail support members 122 and 124. Thereupon fasteners 192 can be tightened to secure the module in the rack.

Cooling air is circulated through each module to cool the circuit components therein and for this purpose housing 178 is provided with apertures in the form of elongate openings or slots 206 and 208 in the top and bottom panels 180 and 182 respectively thereof, where such slots are and arranged in this embodiment to extend from front to rear of the module housing, terminating short of front and rear panels 188 and 190.

When compartment 121 is filled with side-by-side arranged modules, such as modules 51a, 51b, 51c etc. of row 120 as shown in FIG. 8, the bottom apertured panels 182 thereof together with the bottom solid wall panel 134 and with the framework of the lowermost level of rail support members (members 122, 126, 130 and 130' in FIG. 7) define a lowermost, horizontally disposed plenum chamber 210, having horizontal dimensions substantially coextensive with the width and depth dimensions of the rack, and a height or vertical dimension generally defined by the separation between the bottom panel 134 and the bottom apertured panels 182 of the modules.

Similarly, the top apertured panels 180 of the lowermost row 120 of modules 51, as shown in FIG. 8, together with the wall panel 136 and the framework of the intermediate level of rail support members (members 124, 127, 132 and 132' in FIG. 7) define an upper plenum chamber 212 which is substantially coextensive in its horizontal dimension with the width and depth of the rack, and has a height or vertical dimension defined between the mutually opposed surfaces of wall panel 136 and the top apertured panels 180 of the modules. The lower plenum chamber 210 serves as an input plenum, and communicates through an opening in side rail support member 130 with an input duct 114 (FIG. 7), that injects the cool air into plenum 210 (FIG. 8), and henceforth, upwardly through the slots 208 in the bottom apertured panel 182 of each module. Once injected into the module housing through the bottom panel, the coolant is confined by the front, sides, and rear panels of the module, forcing the air to exhaust upwardly through slots 206 in the top apertured panel 180.

The plenum chamber 212 (FIG. 8) overlying the row 120 of modules, serves as an exhaust plenum, collecting spent (warm) air and conducting it away in exhaust duct 116 (FIG. 7) connected to plenum 212 through an opening in a lower half of the side rail support member 132.

The connection of the input duct 114 to plenum 210 is illustrated in FIG. 9, showing an opening 216 in side rail support member 130, while a similar opening 218 is provided in the lower half of side rail support member 132, below the level of horizontal partition 136, as shown in FIG. 9, for placing the exhaust plenum 212 in communication with the exhaust duct 116.

For space and weight savings, a dual plenum chamber arrangement is provided between adjacent rows of modules within rack 32, such as depicted in FIG. 8, in which the wall panel 136 serves as a partition bisecting the space between the top apertured panels 180 of the lower row 120 of modules and the bottom apertured panels of the next higher row 220 of modules (one of which is shown as bottom panel 182' in FIG. 8). The space is thus equally divided between a lower plenum 212, serving as the exhaust plenum overlying row 120 of modules, and an upper plenum chamber 222 serving as the input plenum for the next higher row 220 of modules. Similar dual plenum chambers, corresponding to chambers 212 and 222 in FIG. 8, are horizontally interposed between adjacent row of modules 51, so that each row is served by one input plenum and one exhaust plenum, with the sequence terminating in a single exhaust plenum (not shown) overlying the uppermost row of modules.

The various input plenum chambers are fed in parallel by input duct 114, disposed vertically along the near side of rack 32 as shown in FIG. 7. A plurality of interconnect elastomeric gaskets, such as gaskets 230 and 232, of rectangular shape (FIGS. 7 and 9) sealingly interconnect openings in the side rail support members 130 and 132 that are in registry with openings in duct 114. In this manner, all of the input plenum chambers are charged in parallel, with cool air from a single source. In a similar manner, the exhaust duct 116, extends vertically along the near side of rack 32 from the lowermost exhaust plenum chamber 212 (FIG. 8) upwardly to the uppermost exhaust plenum chamber (not shown), and has a cross section similar to input duct 114. A plurality of elastomeric gaskets, such as gasket 234 shown in FIGS. 7 and 9, sealingly interconnect registering openings in the side members and in exhaust duct 116, where one of such openings is shown in FIG. 9 as opening 218. The various exhaust plenum chambers are thus similarly connected in parallel to the exhaust duct 116, with the upper end of the exhaust duct (not shown) being extended to a suitable discharge location remote from the rack.

As indicated by the drawings, the input cool air is preferably introduced into the lowermost end of input duct 114, and is supplied by blower 110 (FIG. 6), so that the coolant injected into the plenum chambers and housings of rack 32 is at a superambient pressure. By virtue of the particular construction of rack 32, there will be slight leakage of this pressurized cooling air outwardly through the various seals imperfectly formed between the module housings and the guide and support rails and sealing strips, however this leakage is expected and has been found acceptable. The coolant input system including duct 114 and blower 110 may be provided with air filtering means of conventional construction and operation, for limiting the introduction of contaminants in the air that is forced through the rack and module assembly.

Furthermore, the arrangement of the input duct 114 (FIG. 7), the various input and exhaust plenum chambers, such as chambers 210 and 212 respectively (FIG. 8), and the exhaust duct 116 (FIG. 7) are such that the cool air is injected through the apertured bottom panels of the various modules and passed upwardly through each module housing in the same direction as the natural, upward convective flow of warmed air, the air being heated by the transfer of heat from the circuit components to the upwardly flowing input air. Thus for each row of modules, the input plenum for such row underlies the modules, while the exhaust plenum for that row overlies the modules.

Inasmuch as some heating of the coolant occurs by the time it is discharged from the top apertured panels, such as panel 180 of module 51a (FIG. 8), there exists a temperature difference between the spent, exhaust air and the cool, input air in the dual plenum chambers, such as chambers 222 and 212 (FIG. 8), interposed each row of modules. To prevent heating of the input cool air by the underlying and adjacent, warm exhaust air, it is preferable to form partition 136 (FIG. 8) of a thermally insulative material.

Figure 10:
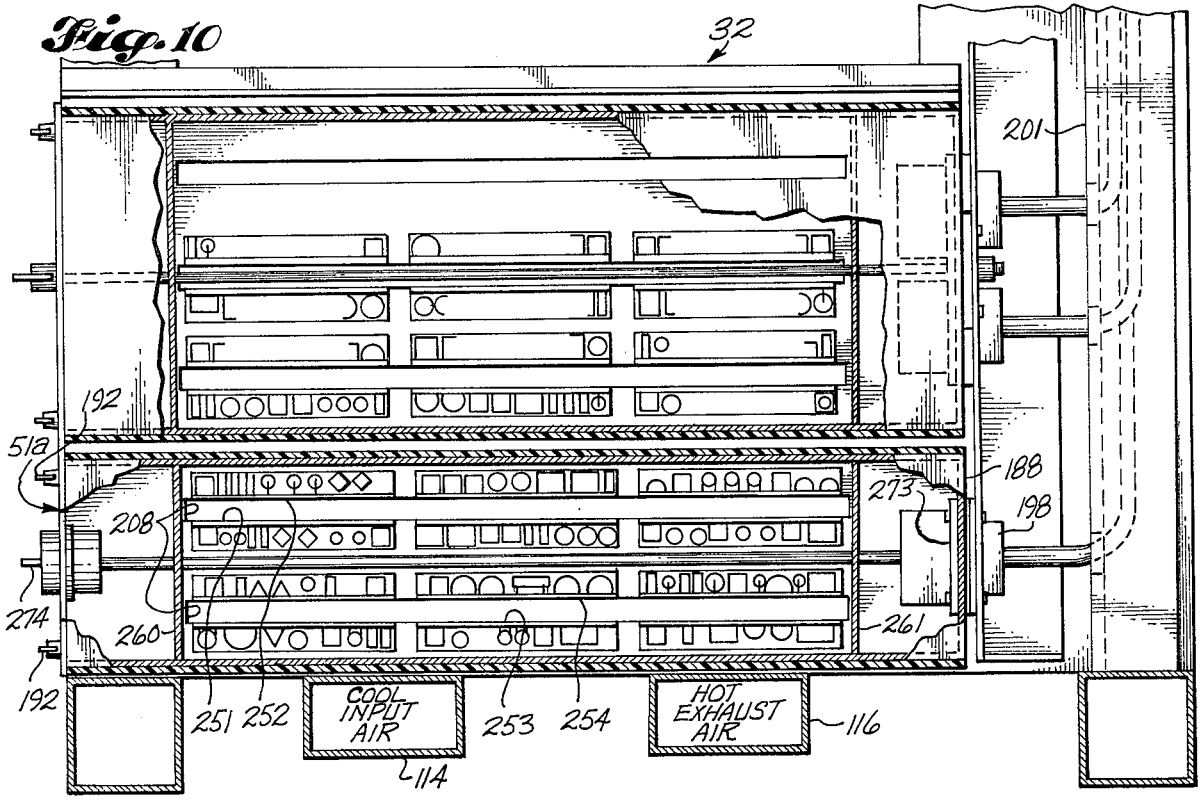
FIG. 10 is a cross-sectional view taken along line 10—10 of FIG. 9, with portions of the housings of the modules being cut away to show the interior arrangement of the electrical and/or electronic components in each module.

With reference to FIGS. 8 and 10, the electrical and electronic components are mounted within each module housing, in the manner illustrated by module 51a, wherein a plurality of printed circuit cards are arranged in pairs 251, 252 and 253, 254, in spaced-apart parallel planes, parallel to the side panels 184 and 186 (FIG. 7). Each pair of cards 251, 252 and 253, 254 is disposed with the printed circuit sides in mutually opposed relation and spaced apart a distance generally equal to the width dimension of slots 206 and 208, and in vertical registration with such slots. The components carried by the circuit cards are disposed on the remote faces of each pair of cards. In this manner, the printed circuit sides of each pair of cards forms a vertically extending chimney, in registry and coextensive in depth with the slots 206 and 208, so that the major portion of the cool input air is passed adjacent the printed, metallic conductors formed on the printed circuit side of the cards, carrying away heat therefrom, without significant contact with the electrical components on the remote sides of the card pairs. This has the advantage of efficiently and uniformly cooling all of the circuit components in each module, without causing unnecessary buildup (on the components) of dust that may be carried into the housing by the coolant. Although the input cool air may be filtered, as described above, nevertheless the air will usually contain some contaminants, and over a lengthy period of time, these contaminants, if circulated passed the components themselves, may tend to form a layer of deposited particulate on the components that reduces the heat dissipative characteristics thereof. In this regard, it is observed that some air space is provided adjacent the component side of the circuit cards, and some communication exists between such air space and the upwardly circulating air between each pair of cards, whereby slight circulation of cooling air is provided adjacent the component sides.

Cards 251, 252, 253 and 254 are of the conventional plug-in type, and accordingly each card has associated therewith a connector assembly, such as assembly 255 of card 251 (FIG. 8) that is elongate and extends parallel to the plane of the card adjacent the lower margin thereof. Such assemblies include a plug portion 256 affixed to and carried by the lower margin of card 251 and a receptacle portion 257 affixed to an internal, horizontal partition 258 (best shown in FIG. 9), spaced elevationally above the bottom apertured wall 182, and provided with elongate air circulation slots 259 lying in vertical registration with slots 206 and 208 of the top and bottom panels 180 and 182 respectively. Cards 251, 252, 253 and 254 are disposed in a separately defined internal compartment within housing 178, formed at the bottom by the above-described horizontal partition 258 (FIG. 9), by a pair of vertical panels 260 and 261 respectively (FIG. 9) disposed parallel to and inwardly from the front and rear panels 190 and 188 respectively and by side panels 184 and top panel 180. The remaining portions of module housing 178 lying outside of the thusly defined card carrying compartment, may be used for interconnect wiring, such as between the card assembly receptacle 257 (FIG. 8), for the controls and indicators mounted on front panel 190, and for the rear connector receptacle 196. The number of cards carried in each module, will vary, and the four cards 251, 252, 253, 254 shown in module 51a, illustrate the number of cards suited for this particular width of module.

With reference to FIGS. 7 and 9, each module, such as illustrated by representative module 51a, is equipped with a jack screw mechanism 270 (FIG. 9) for assisting in overcoming the insertion and withdrawal forces associated with the engagement and disengagement of receptacle 196 and plug 198 at the rear of the module and rack, respectively. As shown in FIGS. 7 and 9, mechanism 270 includes an elongate rod 272 extending lengthwise between the front and back panels 190 and 188 of module 51a and journaled for rotation within circular holes provided in front panel 190, in partitions 260 and 261 (FIG. 9) and in a mounting plate 273 of receptacle 196. Mounting plate 273 lies substantially flush against the inside surface of rear panel 188 of the module as best shown in FIG. 9. The forward end of rod 272 protrudes outwardly from the front surface of front panel 190 and a wing knob 274 is nonrotatably affixed thereto, such that rod 272 may be rotated about its longitudinal axis by manual rotation of the knob at the front of the rack. The rear end of rod 272 protrudes rearwardly from plate 273 and rear panel 188 and is provided with external threads 276. To prevent longitudinal movement of rod 272 with respect to the module housing, two collars 278 and 280 are disposed on rod 272 on opposite sides of the receptacle mounting plate 273 and are secured to the rod by suitable means, such as set screws 282.

A nut member 286 (FIG. 9) is permanently secured to the rear surface mounting plate 288 of plug 198, and a circular hole provided in plate 288 is aligned with the threaded aperture of the nut. When module 51a is inserted into compartment 121 on the guide and support rails 142, 144, 146 and 148 (FIG. 7) rod 272 is aligned with the threaded opening in nut member 286 so that the threads 276 of the rod can be screwed therein. Preferably, the mountings of rod 272 and nut member 286 are disposed as close as possible to the receptacle 196 and plug 198 so that the jack screw force applied to the complemental connector parts, as described more fully herein is uniformly exerted on all the plug pins and complemental receptacle sockets to avoid binding therebetween.

This is advantageously achieved in this embodiment by using a segmented connector assembly, including a segmented receptacle 196 having upper and lower segments 196a and 196b both affixed to mounting plate 273 but having a gap therebetween to accommodate rod 272. Similarly, plug 198 is segmented into complemental upper and lower segments 198a and 198b, both of which are carried by mounting plate 288 fastened to bracket 200, and forming a gap therebetween that permits the interpositioning of nut member 286. In this manner, the rod 272 and nut member 286 are disposed midway between the upper and lower receptacle and plug segments, so that the connector parts are symmetrical with respect to the rod and nut member and the jack screw force is thus applied not only in close proximity to the connector parts, but also equally thereto.

In order to mount module 51a in rack 32, it is initially placed on rails 142, 144, 146 and 148 as described above, and slid rearwardly by pushing on front panel 190 until the connector receptacle 196 and plug 198 commence engagement. At this point, the rear end of rod 272 is threaded into nut member 286 by rotating wing knob 274 clockwise. Continued clockwise rotation of knob 274 causes a cinching force to be exerted between plate 273 (by means of collar 278) and nut member 286, drawing the receptacle 196 (and the module) rearwardly into engagement with the plug 198. Multi-pin connectors such as represented by receptacle 196 and plug 198 can require as much as a one-half pound insertion force per pin, which when multiplied by a large number of pins can constitute a sizable force that must be overcome to effect engagement. By virtue of the force applied through the rotation of rod 272 from the front panel wing knob 274, a relatively large insertion force can be exerted at the rear of the module. This avoids undesirable loading of the module housing, heretofore required when attempting to force the connectors into engagement by a push force applied to the front panel 190. After the connector receptacle 196 and plug 198 are fully engaged, the rearwardly facing surface of the peripheral flange defined by front panel 190 will lie flush against the front of rack 32, such that screws 192 (FIG. 9) can be tightened into mounting holes provided in the front rail support members 122 and 124. To withdraw module 51a from rack 32, the foregoing sequence is simply reversed.

While only the preferred embodiment of this invention has been disclosed herein, it will be readily apparent to persons skilled in the art that numerous changes and modifications can be made thereto without departing from the spirit of the invention. For example, it will be appreciated that the principles of the rack construction shown in FIGS. 7-9 can be embodied in rack in which the compartments are of narrow width and extend from the bottom to the top of the rack for accommodating a vertical stack of modules, corresponding to the row of modules disclosed hereinabove, and in which the imput and exhaust plenum chambers extend in vertical planes on opposite sides of the stack of modules for circulating air through apertured side panels thereof.

What is claimed is:

1. In combination, a rack having first and second compartments therein and a plurality of modules removably disposed in side-by-side relation in first and second horizontal rows in said first and second compartments, respectively, and supported by said rack, said rack comprising a framework of rigid members and first, second and third vertically spaced-apart, horizontal wall panels, said first and second wall panels being disposed and supported by said framework so as to define the bottom and top, respectively, of said first compartment, and said third wall panel being disposed and supported by said framework so that said second and third wall panels define the bottom and top, respectively, of said second compartment;

each of said modules including a substantially enclosed housing containing electrical or electronic components, each said housing being comprised of first and second, vertically spaced-apart, apertured panels forming the bottom and top, respectively, of said housing;

the first apertured panels of the housings of said first row of modules being arranged in a common horizontal plane that is spaced apart from said first wall panel so as to define together with said framework a first plenum chamber for receiving cooling air under pressure so that the cooling air passes into the housings of said first row of modules through apertures in said first apertured panels of such housings, and said second apertured panels of the housings of said first row of modules being arranged in a common horizontal plane that is spaced apart from said second wall panel so as to define therebetween a second plenum chamber having an upper boundary formed by said second wall panel and a lower boundary substantially formed by said second apertured panels of the housings of said first row of modules for receiving air that is exhausted through apertures in said second apertured panels of said housings in said first row of modules;

the first apertured panels of the housings of said second row of modules being arranged in a common horizontal plane spaced apart from said second wall panel so as to define therebetween a third plenum chamber having a lower boundary formed by said second wall panel and an upper boundary substantially formed by said first apertured panels of the housings of said second row of modules for receiving cooling air under pressure so that the cooling air passes into the housings of said second row of modules through apertures in the first apertured panels of such housings, and said second apertured panels of the housings of said second row of modules being arranged in a common horizontal plane that is spaced apart from said third wall panel so as to define with said framework a fourth plenum chamber for receiving air that is exhausted through apertures in said second apertured panels of said housings in said second row of modules;

first conduit means for receiving cooling air under pressure and for conducting such cooling air to said first and third plenum chambers, and second conduit means for conducting exhaust air from said second and fourth plenum chambers to a point remote from said rack.

2. The combination of claim 1 wherein the module housings are arranged in said first and second rows so that for each pair of side-by-side housings the adjacent edges of the first apertured panels and the adjacent edges of the second apertured panels are separated by free space gaps, and wherein said rack further comprises a plurality of guide rail means for guiding each of said modules during insertion and withdrawal from said compartments and for supporting said modules in said compartments, said guide rail means being sized and arranged so as to sealingly engage said first and second apertured panels and so as to seal said gaps between said adjacent edges of said first and second apertured panels.

3. The combination of claim 1 wherein said second wall panel is comprised of a thermally insulating material.

* * * * *